(12) United States Patent
Ohshima

(10) Patent No.: US 7,529,125 B2
(45) Date of Patent: May 5, 2009

(54) SEMICONDUCTOR DEVICE AND OPERATING METHOD THEREOF

(75) Inventor: Kazuaki Ohshima, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/600,834

(22) Filed: Nov. 17, 2006

(65) Prior Publication Data

US 2007/0121402 A1 May 31, 2007

(30) Foreign Application Priority Data

Nov. 25, 2005 (JP) ............... 2005-341109

(51) Int. Cl.
*G11C 11/00* (2006.01)
(52) U.S. Cl. ...................... 365/174; 365/203
(58) Field of Classification Search ................ 365/203, 365/174
See application file for complete search history.

(56) References Cited

U.S. PATENT DOCUMENTS

| 5,303,194 | A | 4/1994 | Suzuki | |
|---|---|---|---|---|
| 6,243,284 | B1 | 6/2001 | Kumagai | |
| 7,170,805 | B2* | 1/2007 | Song | 365/203 |
| 7,209,402 | B2* | 4/2007 | Shinozaki et al. | 365/222 |
| 2003/0076282 | A1 | 4/2003 | Ikeda et al. | |
| 2003/0098875 | A1 | 5/2003 | Kurokawa et al. | |
| 2004/0130959 | A1* | 7/2004 | Kawaguchi | 365/222 |
| 2004/0139271 | A1* | 7/2004 | Khellah et al. | 711/1 |
| 2004/0246799 | A1* | 12/2004 | Song | 365/203 |
| 2004/0252558 | A1* | 12/2004 | Umezawa | 365/189.11 |
| 2005/0041499 | A1* | 2/2005 | Shibayama | 365/210 |
| 2005/0135181 | A1 | 6/2005 | Shionoiri et al. | |

FOREIGN PATENT DOCUMENTS

| JP | 05-128885 | 5/1993 |
|---|---|---|
| JP | 06-089591 | 3/1994 |
| JP | 2000-299394 | 10/2000 |
| JP | 2001-101888 | 4/2001 |
| JP | 2005-203079 | 7/2005 |

OTHER PUBLICATIONS

International Search Report (Application No. PCT/JP2006/323070) dated Dec. 26, 2006.
Written Opinion (Application No. PCT/JP2006/323070) dated Dec. 26, 2006.
Hiroki Dembo et al., RFCPUs on Glass and Plastic Substrates Fabricated by TFT Transfer Technology, IEDW 05, pp. 1067-1069.

* cited by examiner

*Primary Examiner*—Michael T Tran
(74) *Attorney, Agent, or Firm*—Eric J. Robinson; Robinson Intellectual Property Law Office, P.C.

(57) ABSTRACT

An object is to provide a semiconductor device capable of reducing an area of the semiconductor device, reading data reliably, and simplifying replacement of data. A memory cell and a data line are controlled with a reset signal, so that data can be reliably outputted in the semiconductor device. In addition, an element of data holding unit is included, and the data holding unit includes a plurality of memory cells. The area can be reduced by using such a memory cell. A transistor is not connected to GND, thereby simplifying the replacement of data in the memory cell.

12 Claims, 11 Drawing Sheets

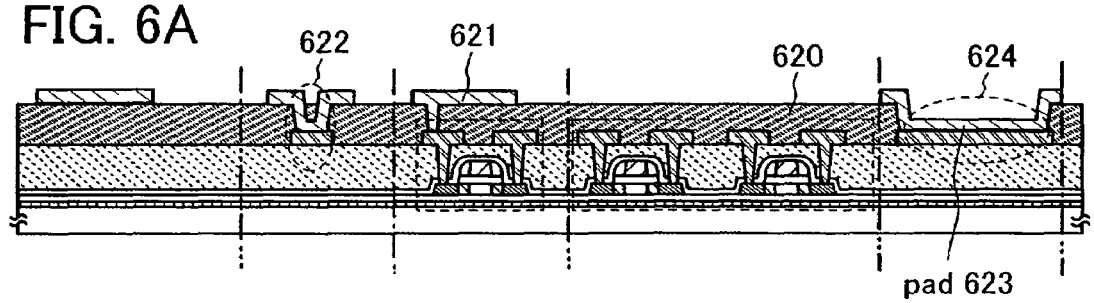
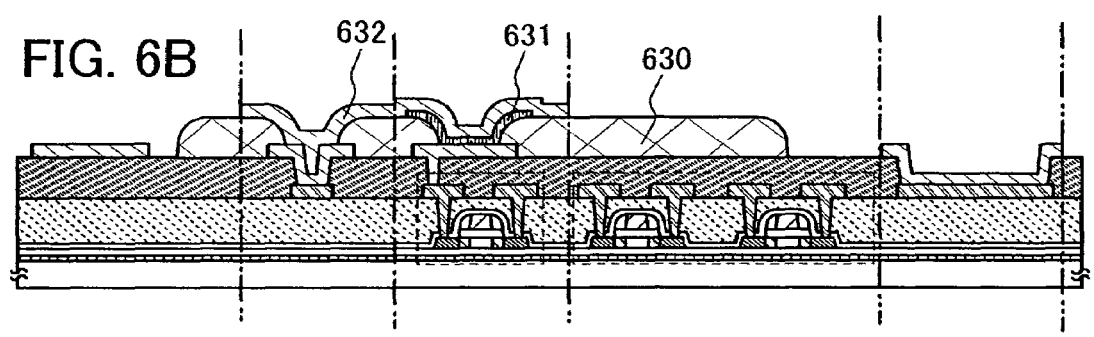
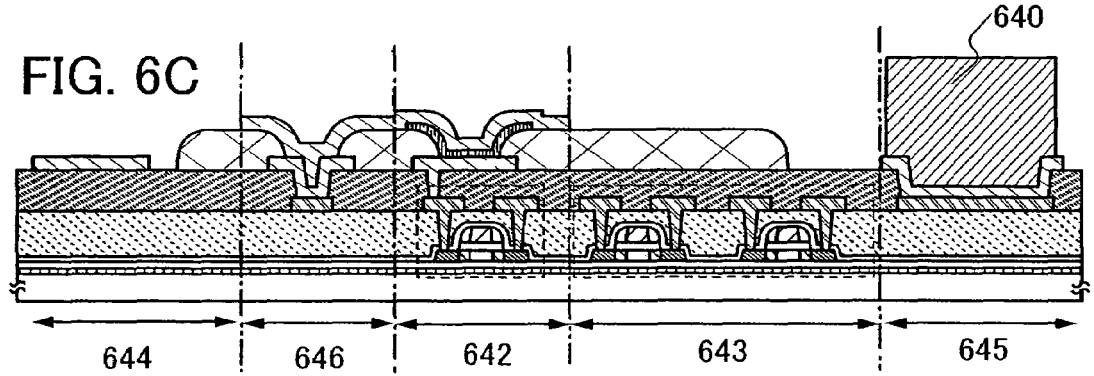

650

SEMICONDUCTOR DEVICE AND OPERATING METHOD THEREOF

TECHNICAL FIELD

The present invention relates to a semiconductor device having a memory area and a method for operating the device.

BACKGROUND ART

With development of computer technologies, a large-capacity memory has been required. To enlarge a capacity of a memory, the number of memory cells may be increased. However, when the number of memory cells is increased, the area is increased, and downsizing of a memory and a computer having the memory is limited.

Such a memory includes a RAM (Random Access Memory) or a ROM (Read Only Memory). The RAM is a rewritable memory, and the ROM is a memory which is readable only.

The RAM and the ROM each have a word line and a data line, and a memory cell is formed at the intersection of these lines. Predetermined information can be made by using binary states (0 and 1) of the memory cell.

As for the ROM, in order to reduce the number of revised masks and improve degree of integration, a structure of a multivalued mask ROM in which potential of the word line is easily controlled at the time of reading is proposed (see Reference 1: Japanese Published Patent Application No. 2000-299394).

In addition, in order to reduce current consumption at the time of selecting the word line, a structure of a ROM in which a data holding unit and a power supply controller are included and the data holding unit has a plurality of memory cells is proposed (see Reference 2: Japanese Published Patent Application No. 2005-203079).

DISCLOSURE OF INVENTION

In the structures of the ROM described in References 1 and 2, a plurality of wires is provided in a memory cell. Such wires greatly affect the integration degree of the ROM. The degree of integration of the wire depends on an exposure technique, and there is a limit to narrow wire width and wire space between wires (line and space). Thus, an object of the present invention is to reduce the number of the wires in a memory cell portion and save space.

In addition, precharging is required for operating the ROM. Accordingly, an object of the present invention is to input a reset signal to a precharge circuit and a word line, so that data can be reliably read.

Further, ROM data has diversity and can be modified frequently. In the case of modifying data, a mask for exposure which is used for forming a wire is required to be modified, thereby increasing manufacturing cost. Thus, an object of the present invention is to modify data by modifying the minimum number of masks in the case of modifying data.

In view of the aforementioned problems, one mode of the present invention is to provide a semiconductor device in which a precharge circuit and a sense amplifier circuit connected to a memory cell through a data line. A word line and a data line are controlled with a reset signal.

In addition, a transistor of the memory cell may be in a floating state without being connected to GND. Accordingly, data rewriting can be easily done by modifying either a contact mask or a wire mask. Such a memory cell is constituted of a word line, a data line, a GND line, and one transistor.

The present invention is specifically described below.

One mode of the present invention is a semiconductor device in which a memory cell, a precharge circuit, and a sense amplifier circuit are electrically connected one another through a data line. The memory cell includes a first transistor of which one electrode is electrically connected to the data line. The precharge circuit includes a second transistor of which one electrode is electrically connected to the data line. The sense amplifier circuit includes a third transistor of which one electrode is electrically connected to the data line, and an inverter of which an input terminal is electrically connected to the data line and of which an output terminal is electrically connected to a gate terminal of the third transistor.

Another mode of the present invention is a semiconductor device in which a memory cell, a precharge circuit, and a sense amplifier circuit are electrically connected to each other through a data line. The memory cell includes a word line and a first transistor of which one electrode is electrically connected to the data line. The precharge circuit includes a second transistor of which one electrode is electrically connected to the data line. The sense amplifier circuit includes a third transistor of which one electrode is electrically connected to the data line, and an inverter of which an input terminal is electrically connected to the data line and of which an output terminal is electrically connected to a gate terminal of the third transistor. The word line is electrically connected to a gate terminal of the first transistor.

Another mode of the present invention is a semiconductor device in which a memory cell, a precharge circuit, and a sense amplifier circuit are electrically connected to each other through a data line, a first inverter, and a NAND. The memory cell includes a word line and a first transistor of which one electrode is electrically connected to the data line. The precharge circuit includes a second transistor of which one electrode is electrically connected to the data line. The sense amplifier circuit includes a third transistor of which one electrode is electrically connected to the data line, and a second inverter of which an input terminal is electrically connected to the data line and of which an output terminal is electrically connected to a gate terminal of the third transistor. The word line is electrically connected to a gate terminal of the first transistor. The first inverter and the NAND are electrically connected to the word line.

Another mode of the present invention is a semiconductor device in which a memory cell, a precharge circuit, and a sense amplifier circuit are electrically connected to each other through a data line, a first inverter, and a NAND. The memory cell includes a word line and a first transistor of which one electrode is electrically connected to the data line. The precharge circuit includes a second transistor of which one electrode is electrically connected to the data line. The sense amplifier circuit includes a third transistor of which one electrode is electrically connected to the data line, and a second inverter of which an input terminal is electrically connected to the data line and of which an output terminal is electrically connected to a gate terminal of the third transistor. The word line is electrically connected to a gate terminal of the first transistor. The first inverter and the NAND are electrically connected to the word line. An address signal and a reset signal are inputted to the NAND.

According to the present invention, the other electrode of the first transistor is set as a ground potential. In specific, the other electrode of the first transistor is electrically connected to a wire, and is set as a ground potential. The other electrode of the first transistor is in a floating state.

According to the present invention, the other electrode of the second transistor is set as a high side potential. The other electrode of the third transistor is set as a high side potential.

According to the present invention, the first transistor is an N-channel transistor, the second transistor is a P-channel transistor, and the third transistor is a P-channel transistor.

One mode of a method for operating a semiconductor device of the present invention includes a memory cell, a precharge circuit, and a sense amplifier circuit which are electrically connected to each other through a data line, and an inverter and a NAND which are electrically connected to the memory cell. A transistor included in the precharge circuit is turned on and a transistor included in the memory cell is turned off by inputting a low signal to the precharge circuit and the NAND as a reset signal, inputting a high signal to the NAND as an address signal, and inputting a high signal to the data line, so that a high signal is outputted from the data line.

Another mode of a method for operating a semiconductor device of the present invention includes a memory cell, a precharge circuit, and a sense amplifier circuit which are electrically connected to each other through a data line, and an inverter and a NAND which are electrically connected to the memory cell. A transistor included in the precharge circuit is turned on and a transistor included in the memory cell is turned off by inputting a low signal to the precharge circuit and the NAND as a reset signal, inputting a low signal to the NAND as an address signal, and inputting a high signal to the data line, so that a high signal is outputted from the data line.

Another mode of a method for operating a semiconductor device of the present invention includes a memory cell, a precharge circuit, and a sense amplifier circuit which are electrically connected to each other through a data line, and an inverter and a NAND which are electrically connected to the memory cell. A transistor included in the precharge circuit is turned off and a transistor included in the memory cell is turned on by inputting a high signal to the precharge circuit and the NAND as a reset signal, inputting a high signal to the NAND as an address signal, and inputting a low signal to the data line, so that a low signal is outputted from the data line.

Another mode of a method for operating a semiconductor device of the present invention includes a memory cell, a precharge circuit, and a sense amplifier circuit which are electrically connected to each other through a data line, and an inverter and a NAND which are electrically connected to the memory cell. A transistor included in the precharge circuit is turned off and a transistor included in the memory cell is turned off by inputting a high signal to the precharge circuit and the NAND as a reset signal, inputting a low signal to the NAND as an address signal, and inputting a low signal to the data line, so that a low signal is outputted from the data line.

A word line and a data line are controlled with a reset signal, so that data can be reliably outputted.

In addition, a memory cell is constituted of one transistor which is connected to a word line, a data line, and a GND line, and space can be saved. By using the memory cell in which space can be saved, the number of memory cells in a substrate can be large and cost can be reduced.

In the memory cell, the transistor is not connected to GND, and rewriting of data can be easily done by modifying either a contact mask or a wire mask for rewriting data.

BRIEF DESCRIPTION OF DRAWINGS

FIGS. 6A to 6C are cross-sectional views showing a process for forming a memory cell in the case of using an organic compound for a wireless chip.

BEST MODE FOR CARRYING OUT THE INVENTION

Embodiment Mode

Figure 1:
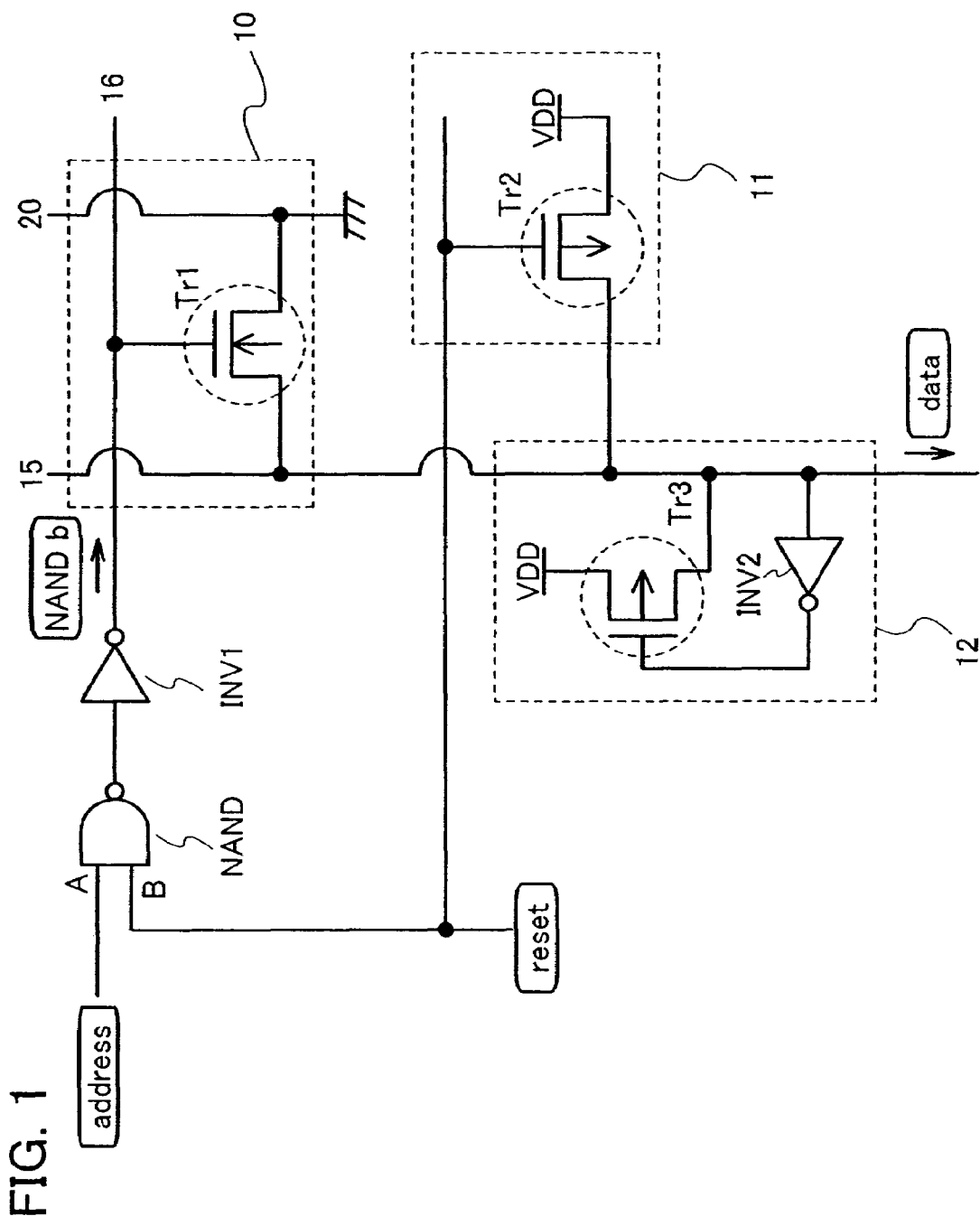
FIG. 1 is an overall view showing a state where a transistor in a memory cell is connected to GND in a semiconductor device of the present invention.

Hereinafter, embodiment modes of the present invention will be described with reference to the drawings. However, it is to be easily understood by those skilled in the art that the present invention can be implemented in many different ways, and modes and details herein disclosed can be modified in various ways without departing from the purpose and the scope of the present invention. Therefore, the present invention should not be interpreted as being limited to the description of the embodiment modes to be given below. Through the drawings of the embodiment modes, like components or components having the same functions are denoted by the same reference numerals and will not be explained repeatedly.

Embodiment Mode 1

A structure of a semiconductor device having a memory cell and the like and an operation thereof are described in this embodiment mode.

FIG. 1 shows a memory cell 10, and a precharge circuit 11 and a sense amplifier circuit 12 which are connected to the memory cell 10 through a data line 15. The memory cell 10 includes an N-channel transistor (Tr1), and a gate terminal of the transistor (Tr1) is connected to a word line 16. An inverter (INV1) and a NAND are connected to the word line 16 in series, and an address signal (address) and a reset signal (reset) are inputted to input terminals of the NAND. A signal based on the address signal and the reset signal is outputted from an output terminal of the NAND, and this signal is inverted by the INV1. This signal which has been inverted, that is an inverted signal is inputted to the gate terminal of the transistor (Tr1). The present invention is not limited to the combination of the NAND and the INV1 as long as the signal based on the address signal and the reset signal is inverted and inputted to the gate terminal of the transistor (Tr1). For example, a circuit in which two INVs and one NOR are combined can be employed. One electrode of the transistor (Tr1) is connected to the data line 15, and the other electrode thereof is grounded (GND connection). That is, the other electrode is set as a ground potential. A wire which is grounded in this manner is a GND line 20.

The precharge circuit 11 connected to the memory cell 10 through the data line 15 includes a P-channel transistor (Tr2). One electrode of the transistor (Tr2) is connected to the data line 15, and the other electrode thereof is a VDD (high side potential). The reset signal is inputted to a gate terminal of the transistor (Tr2).

The sense amplifier circuit 12 connected to the memory cell 10 through the data line 15 includes a P-channel transistor (Tr3) and an inverter (INV2). One electrode of the transistor (Tr3) is connected to the data line 15, and the other electrode thereof is a VDD potential. A gate terminal of the transistor (Tr3) is connected to the output terminal of the inverter (INV2), and the input terminal thereof is connected to the data line 15.

An operation in such a circuit is described. First, an operation in which a low (0) signal is outputted to the data line 15. To output low (0) to the data line, the transistor (Tr1) of the memory cell 10 is connected to GND in FIG. 1.

Figure 3:
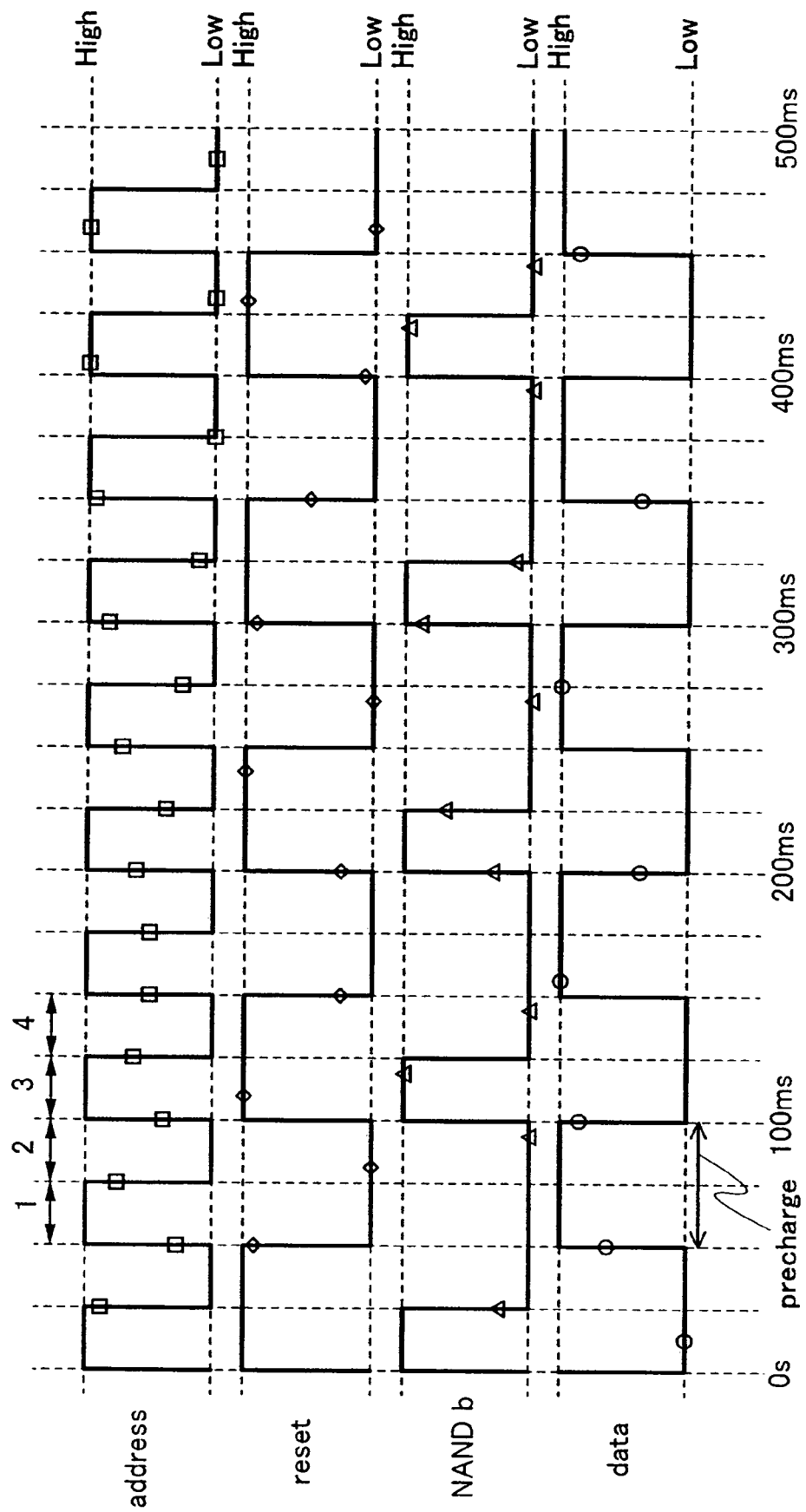
FIG. 3 is a timing chart showing an operation of FIG. 1.

FIG. 3 shows a timing chart. A series of operations which is divided into a period 1, a period 2, a period 3, and a period 4 are described.

During the period 1, a low (0) signal is inputted to an input terminal B of the NAND as a reset signal. A high (1) signal is inputted to an input terminal A of the NAND as an address signal. Therefore, the NAND outputs a high (1) signal. The output of a high state (1) is in a low state (0) by the INV1 (this is referred to as a NANDb signal). The NANDb signal is inputted to the gate terminal of the transistor (Tr1) of the memory cell 10, and the transistor (Tr1) is in an off state. At the same time, a low (0) signal is inputted to the gate terminal of the transistor (Tr2) of the precharge circuit 11 as the reset signal, the transistor (Tr2) of the precharge circuit 11 is in an on state, and high (1) is outputted. Thus, the data line is in a high state (1), and an output of data (data) is in a high state (1).

During the period 2, a low (0) signal is inputted to the input terminal B of the NAND as a reset signal. A low (0) signal is inputted to the input terminal A of the NAND as an address signal. Therefore, the NAND outputs high (1). The output of a high state (1) is in a low state (0) by the INV1 (NANDb signal). The NANDb signal is inputted to the gate terminal of the transistor (Tr1) of the memory cell 10, and the transistor (Tr1) is in an off state. At the same time, a low (0) signal is inputted to the gate terminal of the transistor (Tr2) of the precharge circuit 11 as the reset signal, the transistor (Tr2) of the precharge circuit 11 is in an on state, and high (1) is outputted. Thus, the data line 15 is in a high state (1), and the output of the data (data) is in a high state (1).

During the period 3, a high (1) signal is inputted to the input terminal B of the NAND as a reset signal. A high (1) signal is inputted to the input terminal A of the NAND as an address signal. Therefore, the NAND outputs a low (0) signal. The output of a low state (0) is in a high state (1) by the INV1 (NANDb signal). The NANDb signal is inputted to the gate terminal of the transistor (Tr1) of the memory cell 10, and the transistor (Tr1) is in an on state. The data line 15 is in a low state (0). At the same time, a high (1) signal is inputted to the gate terminal of the transistor (Tr2) of the precharge circuit 11 as the reset signal, and the transistor (Tr2) of the precharge circuit 11 is in an off state. Thus, the data line 15 is in a low state (0), and the output of the data (data) is in a low state (0).

During the period 4, a high (1) signal is inputted to the input terminal B of the NAND as a reset signal. A low (0) signal is inputted to the input terminal A of the NAND as an address signal. Therefore, the NAND outputs a high (1) signal. The output of a high state (1) is in a low state (0) by the INV1 (NANDb signal). The NANDb signal is inputted to the gate terminal of the transistor (Tr1) of the memory cell 10, and the transistor (Tr1) is in an off state. At the same time, a high (1) signal is inputted to the gate terminal of the transistor (Tr2) of the precharge circuit 11 as the reset signal, and the transistor (Tr2) of the precharge circuit 11 is in an off state. Since the data line 15 has been in a low state (0) during the period 3 which is a state prior to the period 4, the data line 15 is in a low state (0) even during the period 4, and the output of the data (data) is in a low state (0).

In the memory cell of this embodiment mode, the word line and the data line are controlled with the reset signal, so that data can be reliably outputted.

In addition, the memory cell is constituted of one transistor which is connected to the word line, the data line, and the GND line, and space can be saved. Accordingly, cost of the memory cell can be reduced and a device having it can be realized.

Embodiment Mode 2

A structure of a semiconductor device having a memory cell which is different from the aforementioned embodiment mode, or the like, and an operation of the semiconductor device are described in this embodiment mode.

Figure 2:
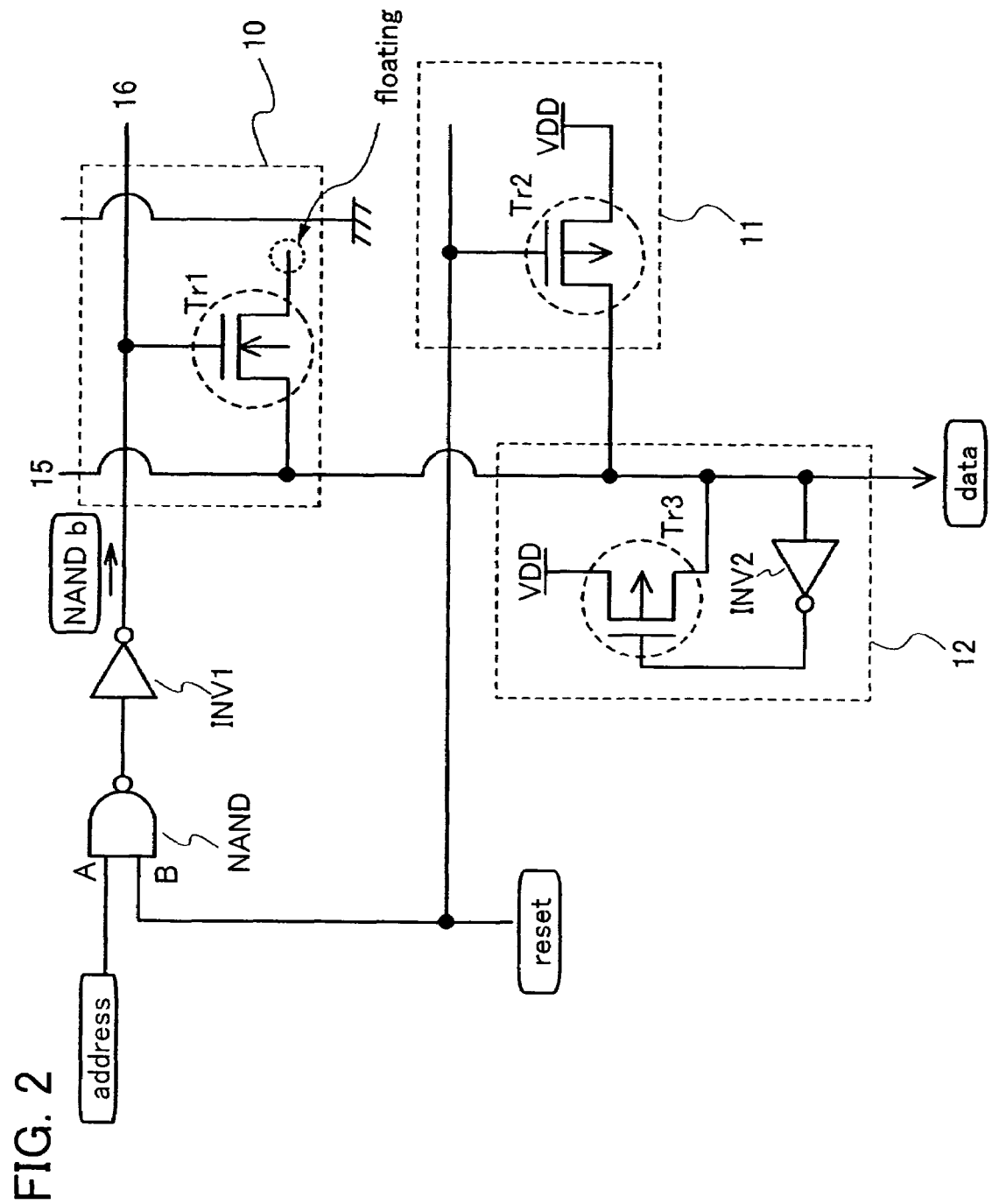
FIG. 2 is an overall view showing a state where a transistor in a memory cell is not connected to GND in a semiconductor device of the present invention.

FIG. 2 shows the memory cell 10, the precharge circuit 11 and the sense amplifier circuit 12 which are connected to the memory cell 10 through the data line 15. A structural difference between FIG. 1 and FIG. 2 is in that the transistor (Tr1) of the memory cell 10 is not connected to GND and in a floating state. The transistor (Tr1) in the memory cell is not connected in this manner; therefore, data can be changed by modifying either a contact mask or a wire mask at the time of rewriting data of the memory cell. Through a simple process in this manner, the data of the memory cell can be rewritten. Since the other configuration is similar, description is omitted.

Figure 4:
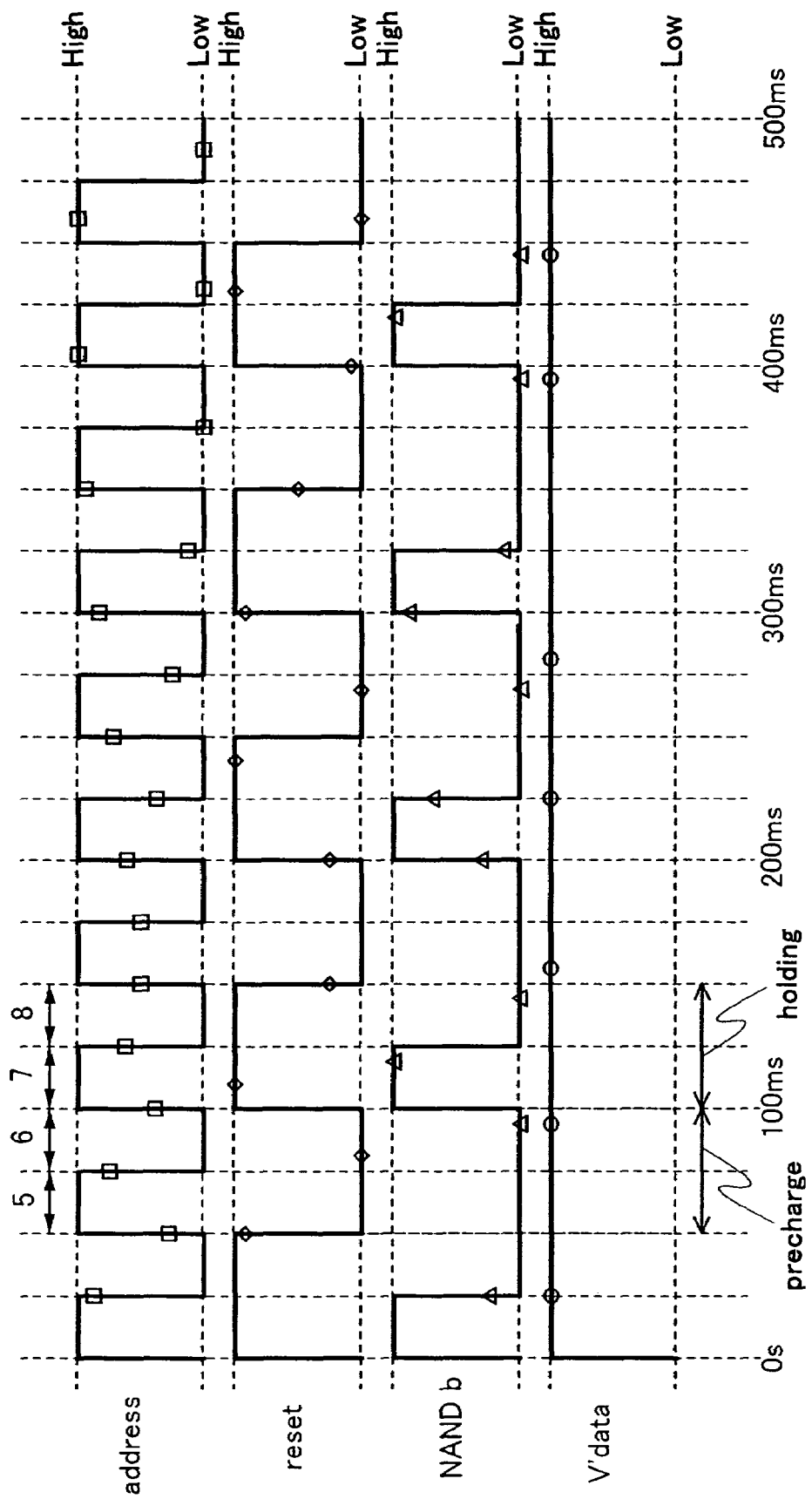
FIG. 4 is a timing chart showing an operation of FIG. 2.

FIG. 4 shows a timing chart. A series of operations which is divided into a period 5, a period 6, a period 7, and a period 8 are described.

During the period 5, a low (0) signal is inputted to the input terminal B of the NAND as a reset signal. A high (1) signal is inputted to the input terminal A of the NAND as an address signal. Therefore, the NAND outputs a high (1) signal. The output of a high state (1) is in a low state (0) by the INV1 (NANDb signal). The NANDb signal is inputted to the gate terminal of the transistor (Tr1) of the memory cell 10, and the transistor (Tr1) is connected only to the word line 16 and the data line 15, and so that the transistor (Tr1) is in an off state. At the same time, a low (0) signal is inputted to the gate terminal of the transistor (Tr2) of the precharge circuit 11 as the reset signal, the transistor (Tr2) of the precharge circuit 11 is in an on state, and high (1) is outputted. Thus, the data line is in a high state (1), and the output of the data (data) is in a high state (1).

During the period 6, a low (0) signal is inputted to the input terminal B of the NAND as a reset signal. A low (0) signal is inputted to the input terminal A of the NAND as an address signal. Therefore, the NAND outputs a high (1) signal. The output of a high state (1) is in a low state (0) by the INV1 (NANDb signal). The NANDb signal is inputted to the gate terminal of the transistor (Tr1) of the memory cell 10, and the transistor (Tr1) is connected only to the word line and the data line, and so that the transistor (Tr1) is in an off state. At the same time, a low (0) signal is inputted to the gate terminal of the transistor (Tr2) of the precharge circuit 11 as the reset signal, the transistor (Tr2) of the precharge circuit 11 is in an on state, and high (1) is outputted. Thus, the data line 15 is in a high state (1), and the output of the data (data) is in a high state (1).

During the period 7, a high (1) signal is inputted to the input terminal B of the NAND as a reset signal. A high (1) signal is inputted to the input terminal A of the NAND as an address signal. Therefore, the NAND outputs a low (0) signal. The output of a low state (0) is in a high state (1) by the INV1 (NANDb signal). The NANDb signal is inputted to the gate terminal of the transistor (Tr1) of the memory cell 10, and the transistor (Tr1) is connected only to the word line and the data line, and so that the transistor (Tr1) is in an off state. At the same time, a high (1) signal is inputted to the gate terminal of the transistor (Tr2) of the precharge circuit 11 as the reset signal, and the transistor (Tr2) of the precharge circuit 11 is in an off state. Since the data line 15 has been in the high state (1) during the period 6 which is a state prior to the period 7, and the high state (1) has been kept by using the sense amplifier circuit 12, the data line 15 is in a high state (1) even during the period 7, and the output of the data (data) is in a high state (1).

During the period 8, a high (1) signal is inputted to the input terminal B of the NAND as a reset signal. A low (0) signal is inputted to the input terminal A of the NAND as an address signal. Therefore, the NAND outputs a high (1) signal. The output of a high state (1) is in a low state (0) by the INV1 (NANDb signal). Since the NANDb signal is inputted to the gate terminal of the transistor (Tr1) of the memory cell 10, and the transistor (Tr1) is connected only to the word line and the data line, and so that the transistor (Tr1) is in an off state. At the same time, a high (1) signal is inputted to the gate terminal of the transistor (Tr2) of the precharge circuit 11 as the reset signal, and the transistor (Tr2) of the precharge circuit 11 is in an off state. Since the data line 15 has been in the high state (1) during the period 7 which is a state prior to the period 8, and the high state (1) has been kept by using the sense amplifier circuit 12, the data line 15 is in a high state (1) even during the period 8, and the output of the data (data) is in a high state (1).

In the memory cell of this embodiment mode, the word line and the data line are controlled with the reset signal, so that data can be reliably outputted.

In addition, the memory cell is constituted of one transistor which is connected to the word line, the data line, and the GND line, and space can be saved. Accordingly, cost of the memory cell can be reduced and a device having it can be realized.

Further, ROM data has diversity and can be modified frequently. In the case of modifying data, a mask for exposure which is used for forming a wire is required to be modified, thereby increasing manufacturing cost. The modification of data is required from the change of a mask for exposure of a wire, which is expensive. However, as in this embodiment mode, data is recognized depending on whether the transistor of the memory cell is connected to GND; therefore, data can be modified by modifying one contact mask or one wire mask.

Embodiment Mode 3

In this embodiment mode, as a structural example of a semiconductor device of the present invention, a wireless chip provided with a semiconductor device having a memory cell is described. A method for manufacturing the wireless chip is described below.

Figure 5A:
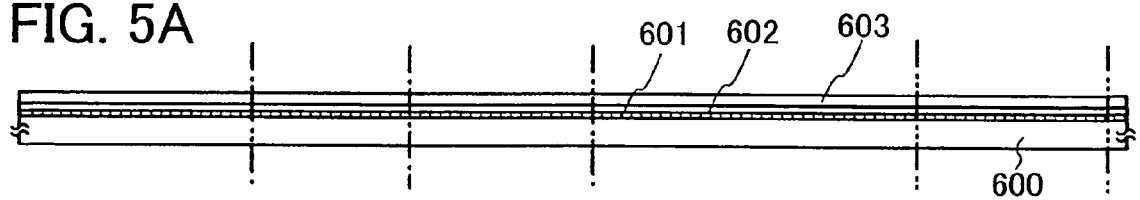
FIGS. 5A to 5D are cross-sectional views showing a process for forming transistors of the present invention.

In FIG. 5A, a release layer 601, an insulating layer 602, and a semiconductor film 603 are sequentially formed over a substrate having an insulating surface (hereinafter referred to as an insulating substrate) 600. As the insulating substrate 600, a glass substrate, a quartz substrate, a substrate which is made of silicon, a metal substrate, a plastic substrate, or the like can be employed. In addition, the insulating substrate 600 may be thinned by polishing. By employing the thinned insulating substrate, a finished product can be reduced in weight and thickness.

The release layer 601 can be formed of an element selected from W, Ti, Ta, Mo, Nb, Nd, Ni, Co, Zr, Zn, Ru, Rh, Pd, Os, Ir, or Si, an alloy material containing any of these elements as a main component, or a compound material containing any of these elements as a main component. The release layer can have either a single-layer structure including the aforementioned element or the like or a layered structure including the aforementioned element or the like. Such a release layer can be formed by CVD, sputtering, an electron beam, or the like. In this embodiment mode, W is used for the release layer which is formed by CVD. At this time, plasma treatment may be performed by using $O_2$, $N_2$, or $N_2O$; thereby, a separation step which is a later step can easily be performed. The release layer 601 can have either a single-layer structure or a layered structure. In addition, the release layer 601 is not required to be formed over the entire insulating substrate, and may be formed selectively. That is, a region in which the release layer 601 is formed is not limited as long as the insulating substrate 600 can be separated later.

An inorganic material such as silicon oxide or silicon nitride can be employed for the insulating layer 602. The insulating layer 602 can have either a single-layer structure or a layered structure. Employing silicon nitride can prevent impurity elements from entering from the insulating substrate. In the case of using a layered structure, such silicon nitride has an advantageous effect when contained in any one of layers.

A material containing silicon can be employed for the semiconductor film 603. The semiconductor film can be formed by CVD or sputtering. A crystal structure of the semiconductor film 603 may be any of an amorphous structure, a crystalline structure, or a micro-crystalline structure. Mobility of a thin film transistor can be increased as crystallinity increases, which is preferable. Alternatively, by employing a microcrystalline or amorphous structure, crystal states of semiconductor films which are adjacent to each other do not vary, which is preferable.

In order to form a crystalline semiconductor film, the crystalline semiconductor film may be formed directly over the insulating layer 602; however, the crystalline semiconductor film is manufactured by heating an amorphous semiconductor film formed over the insulating layer 602. For example, heat treatment is performed on the amorphous semiconductor film by using heating furnace or laser irradiation. Accordingly, a semiconductor film having high crystallinity can be formed. At this time, in order to lower the heating temperature, a metal element which promotes crystallization may be employed. For example, nickel (Ni) may be added to a surface of the amorphous semiconductor film and heat treatment may be performed, so that the processing temperature can be lowered. Therefore, a crystalline semiconductor film can be formed over an insulating substrate having low heat resistance. Note that in the case of employing laser irradiation, since a semiconductor film is heated selectively, heating temperature is not restricted by heat resistance of an insulating substrate that is used.

Figure 5B:
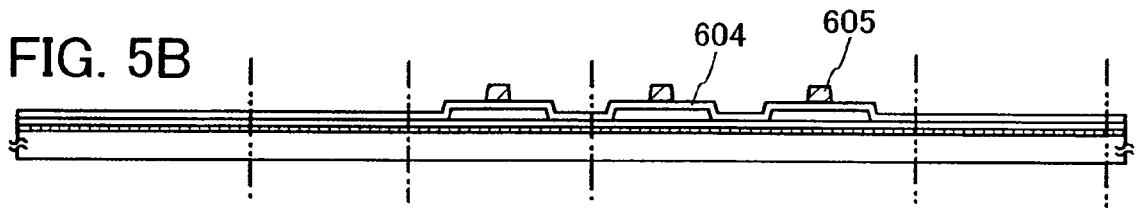

As shown in FIG. 5B, the semiconductor film 603 is processed to have a predetermined shape. Etching using a mask formed by photolithography can be employed for the processing. Either dry etching or wet etching can be used for the etching.

An insulating layer which functions as a gate insulating film 604 is formed so as to cover the processed semiconductor film. The gate insulating film 604 can be formed by using an inorganic material; for example, silicon nitride or silicon oxide can be used. Plasma treatment may be performed before or after forming the gate insulating film 604. Oxygen plasma or hydrogen plasma can be used for the plasma treatment. By performing such plasma treatment, impurities on a surface where the gate insulating film is formed or a surface on the gate insulating film can be removed.

After that, a conductive layer which functions as a gate electrode 605 is formed over the semiconductor film with the gate insulating film 604 interposed therebetween. The gate electrode 605 can have either a single-layer structure or a layered structure. The gate electrode 605 can be formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), or indium (In), an alloy material containing any of these elements as a main component, or a compound material containing any of these elements as a main component.

Figure 5C:
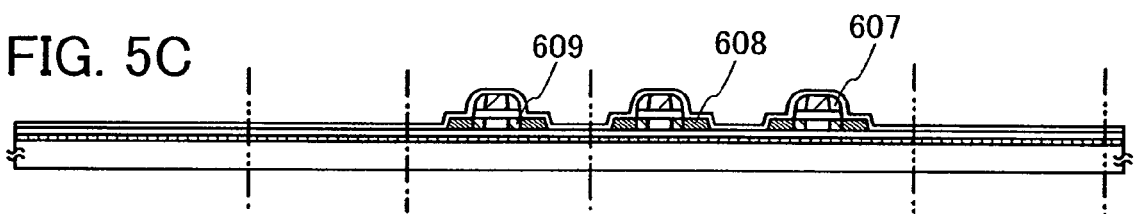

As shown in FIG. 5C, an insulator which functions as a sidewall 607 is formed on each side of the gate electrode 605. The sidewall 607 can be formed by using an inorganic material or an organic material. Silicon oxide and silicon nitride can be given as examples of the inorganic material. For example, when silicon oxide is used so as to cover the gate electrode 605 and isotropic etching is performed, the silicon oxide remains only on each side of the gate electrode 605 which can be used as the sidewall. Either dry etching or wet etching can be used for the isotropic etching. When the sidewall 607 is processed, the gate insulating film 604 is also etched away partially. Accordingly, a part of the semiconductor film is exposed.

Employing the sidewall 607 and the gate electrode 605, the semiconductor film is doped with impurity elements in a self-aligned manner. Accordingly, impurity regions having different concentrations are formed in the semiconductor film. An impurity region 609 formed below the sidewall 607 has lower concentration than the concentration of an impurity region 608 formed in the semiconductor film which is exposed. By varying the concentrations of the impurity regions in this manner, a short-channel effect can be prevented.

Figure 5D:
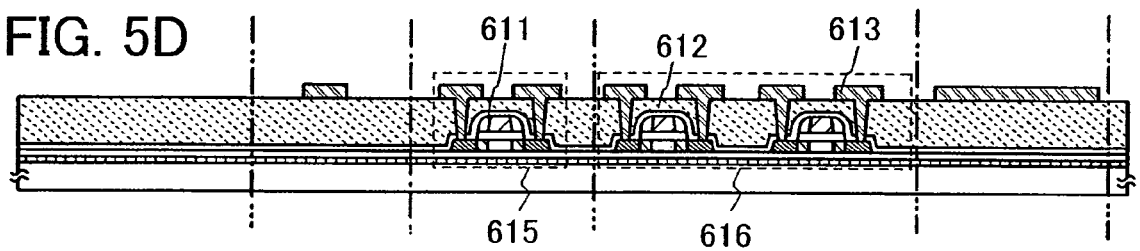

As shown in FIG. 5D, insulating layers 611 and 612 are formed to cover the semiconductor film, the gate electrode, and the like. The insulating layer which covers the semiconductor film, the gate electrode, and the like may have a single-layer structure; however, the insulating layer preferably has a layered structure as described in this embodiment mode. This is because forming the insulating layer 611 by using an inorganic material can prevent impurities from entering, and a dangling bond in the semiconductor film can be terminated by using hydrogen in the insulating layer 611, by applying an inorganic material using CVD. After that, planarity can be improved by forming the insulating layer 612 using an organic material. As the organic material, polyimide, acrylic, polyamide, polyimide amide, benzocyclobutene, siloxane, or polysilazane can be employed. Note that siloxane is composed of a skeleton formed by the bond of silicon (Si) and oxygen (O). As a substituent, an organic group containing at least hydrogen (e.g., an alkyl group or aromatic hydrocarbon) is employed. As the substituent, a fluoro group may also be employed. Alternatively, an organic group containing at least hydrogen and a fluoro group may be used as the substituent. Polysilazane is formed by employing a polymer material having a bond of silicon (Si) and nitrogen (N) as a starting material.

Then, a wire 613 which penetrates through the insulating layers 611 and 612, and the gate insulating film 604 and contacts with the impurity region 608 is formed to. The wire 613 can have either a single-layer structure or a layered structure. The wire 613 can be formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), or indium (In), or an alloy material containing any of these elements as a main component. Other wires can be formed over the insulating layer 612 at the same time as the wire 613. The other wires correspond to a leading wire and the like.

A thin film transistor (TFT) 615 and a TFT array 616 can be formed in this manner. The TFT group corresponds to a group of TFTs which forms a circuit having a certain function. A ROM can be formed by using the TFT array 616.

As shown in FIG. 6A, an insulating layer 620 is formed over the insulating layer 612. The insulating layer 620 can be formed by using an inorganic material or an organic material similarly to the insulating layers 611 and 612. A wire 621 is formed so as to penetrate through the insulating layer 620. The wire 621 can be formed similarly to the wire 613. The wire 621 is electrically connected to the wire 613 in a region 622 through an opening which is provided in the insulating layer 620. In the region 622, a common electrode of a memory cell which is to be formed later can be grounded. In addition, a pad 623 is formed of the same layer as the wire 621. The pad 623 is electrically connected to a wire 619 in a region 624 through an opening which is provided in the insulating layer 620.

As shown in FIG. 6B, an insulating layer 630 is formed over the insulating layer 620. The insulating layer 630 can be formed by using an inorganic material or an organic material similarly to the insulating layers 611 and 612. The insulating layer 630 is processed so as to have tapered sides.

An organic compound layer 631 is formed in an opening which is provided over the TFT 615. The organic compound layer 631 can be formed by evaporation or sputtering. Such an organic compound layer can be formed of an electroluminescent material. Then, a wire 632 is formed so as to partially cover the organic compound layer 631 and the insulating layer 630. The wire 632 can be formed similarly to the wire 621. A region in which the wire 632 is formed corresponds to a memory region and a contact region. The wire 632 serves as a common electrode of the memory cell. A ROM can be formed by using such a memory cell having an organic compound layer.

As shown in FIG. 6C, an antenna 640 is formed. At this time, the pad 623 and the antenna 640 are electrically bonded together by thermocompression. A wireless chip having a wire region 644 in which the leading wire or the like is formed, a memory region 642 in which the memory cell is formed, an integrated circuit area 643 having the TFT group and a circuit with a specific function, a pad region 645, and a contact region 646 is formed in this manner. The pad region and the memory region are provided to be separated from each other to some extent. Accordingly, writing of data can be performed without being affected by stress at the time of bonding the antenna by thermocompression.

In addition, the pressure bonding of the antenna may be performed in a condition where the flexibility of the insulating substrate is low. Therefore, in this embodiment mode, a mode where the thin film transistor or the like is transferred onto a film substrate after the pressure bonding of the antenna is described.

Figure 7A:
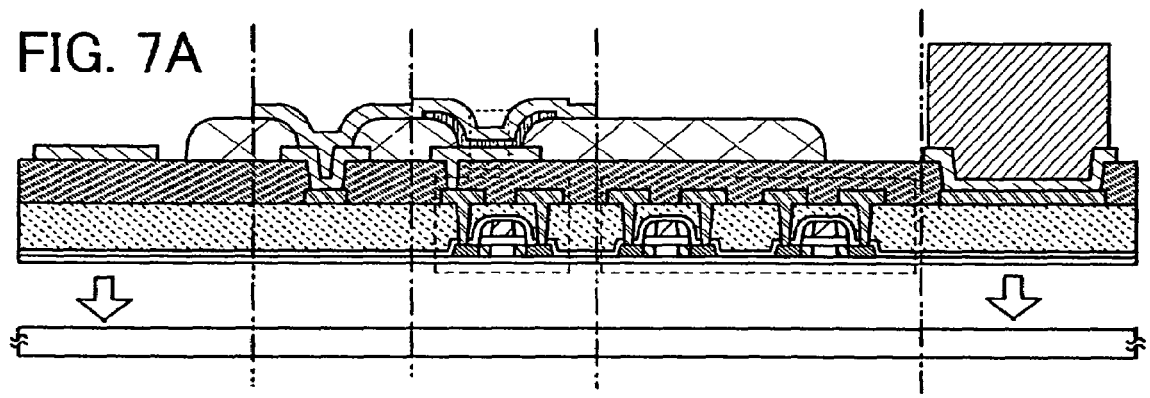
FIGS. 7A and 7B are cross-sectional views showing steps of separation and adhesion in manufacturing of a semiconductor device of the present invention.

As shown in FIG. 7A, the insulating substrate 600 is separated by removing the release layer 601. The release layer 601 can be removed physically or chemically. For example, the crystal structure of the release layer 601 can also be changed by performing heat treatment or the like on the semiconductor film. After that, an opening is provided so as to partially expose the release layer 601, and the exposed release layer 601 is irradiated with laser. The release layer 601 is irradiated with laser, thereby triggering separation. Then, the insulating substrate can be separated physically from the thin film transistor or the like, and eventually, the thin film transistor or the like may naturally separate from the insulating substrate due to stress of the film without applying additional power from outside. Further, when an opening which reaches the release layer 601 is formed and an etchant is introduced through the opening, so that the release layer 601 can be removed by chemical reaction.

Figure 7B:
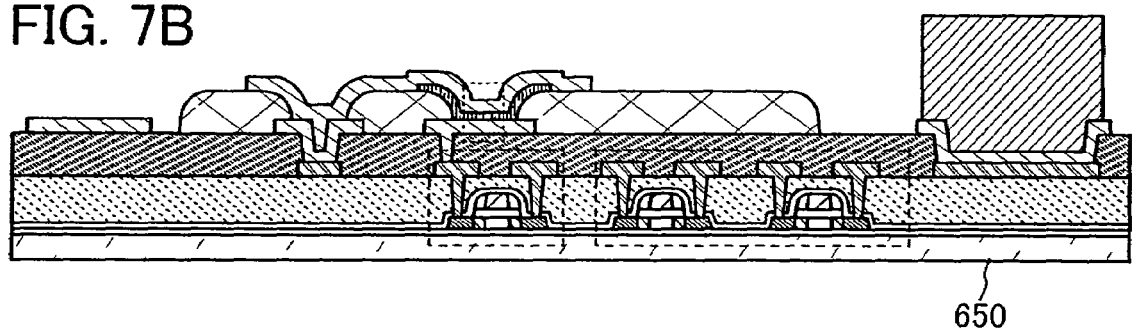

Then, as shown in FIG. 7B, a film substrate 650 is attached. When a surface of the film substrate 650 has an adhesive property, it can be attached as it is. When the surface of the film substrate 650 does not have the adhesive property, it can be attached with an adhesive agent.

Thus, a wireless chip in which the thin film transistor or the like are transferred onto the film substrate can be formed.

In this manner, a wireless chip of this embodiment mode can be formed either by using a TFT group or by using a memory cell having an organic compound layer. Operating characteristics are improved by employing the TFT group, and cost can be reduced by employing a memory cell having the organic compound layer.

Embodiment Mode 4

In this embodiment mode, a wireless chip having a memory cell is described as a structural example of the present invention. In addition, the shape of an antenna formed over a substrate for an antenna, which is applied to the wireless chip is described.

As a transmission method of signals using the wireless chip, an electromagnetic coupling method or an electromagnetic induction method (e.g., 13.56 MHz band) can be applied. In the case of employing the electromagnetic induction method, a conductive layer which functions as the antenna is formed to be circular (e.g., a loop antenna) or spiral (e.g., a spiral antenna) since electromagnetic induction with the change of magnetic field density is utilized.

Alternatively, in the case of applying a micro-wave method (e.g., UHF band (860 to 960 MHz band), 2.45 GHz band, or the like) as the transmission method of the signals in the wireless chip, a shape of dimensions or the like of the conductive layer which functions as the antenna is determined considering wavelength of electromagnetic wave which is employed for transmission of the signals. For example, the conductive layer which functions as the antenna can be formed to have a linear shape (e.g., a dipole antenna), a flat shape (e.g., a patch antenna), a ribbon shape, or the like. In addition, the shape of the conductive layer which functions as the antenna is not limited to have the linear shape; it may be provided to have a curved shape, a serpentine shape, or a combination of such shapes considering the wavelength of the electromagnetic wave.

Figure 8A:
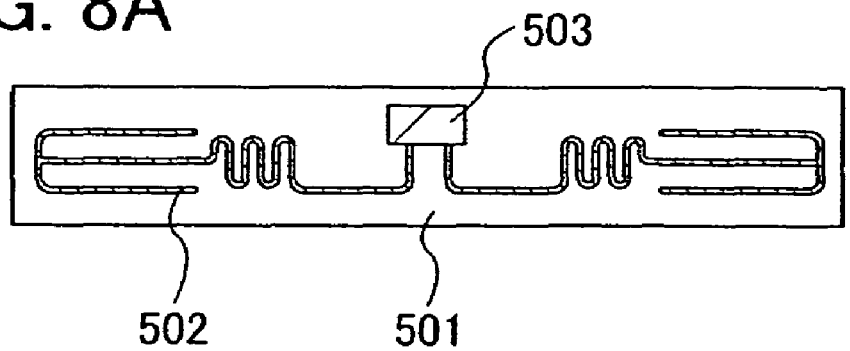
FIGS. 8A to 8C are cross-sectional views each showing an antenna shape.

FIG. 8A shows an example where the conductive layer which functions as the antenna is formed to have a narrow linear shape and a rectangular shape. In FIG. 8A, an integrated circuit 503 provided with the memory region having the ROM to which the present invention is applied or the like is attached to a substrate for an antenna 501 over which a conductive layer (a dipole antenna) 502 which functions as an antenna is formed.

Figure 8B:
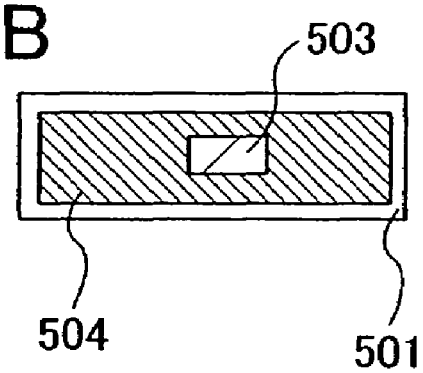

FIG. 8B shows an example where the conductive layer which functions as the antenna is formed to have a wide linear shape. In FIG. 8B, the integrated circuit 503 provided with the memory region having the ROM to which the present invention is applied or the like is attached to the substrate for the antenna 501 over which a conductive layer (a patch antenna) 504 which functions as an antenna is formed.

Figure 8C:
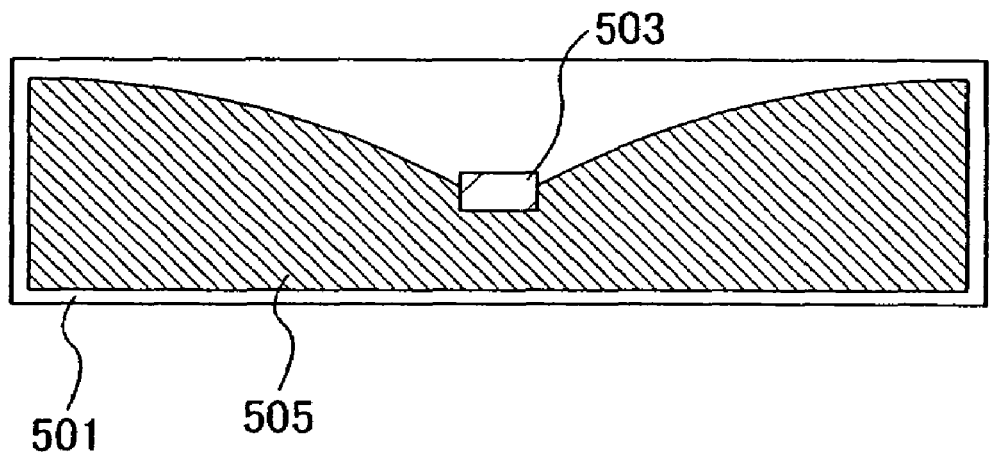

FIG. 8C shows an example where the conductive layer which functions as the antenna is formed to have a ribbon shape (also referred to as flabellate). In FIG. 8C, the integrated circuit 503 provided with the memory region having the ROM to which the present invention is applied or the like is attached to the substrate for the antenna 501 over which a conductive layer 505 which functions as an antenna is formed.

The conductive layer which functions as the antenna is formed of a conductive material over the substrate for the antenna by using CVD, sputtering, a printing method such as a screen printing method or a gravure printing method, a droplet discharge method, a dispensing method, a plating method, or the like. The conductive material is an element selected from aluminum (Al), titanium (Ti), silver (Ag), copper (Cu), gold (Au), platinum (Pt), nickel (Ni), palladium (Pd), tantalum (Ta), molybdenum (Mo), or indium (In), an alloy material containing any of these elements as a main component, or a compound material containing any of these elements as a main component. The conductive layer is formed to have a single-layer structure or a layered structure.

For example, in the case of forming the conductive layer which functions as the antenna by using a screen printing method, it can be selectively applied by printing a conductive paste in which conductive particles having a particle size of several nm to several ten μm are dissolved or dispersed in an organic resin. As the conductive particles, metal particles of one or more kinds from any of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersing nano particles can be employed. In addition, as the organic resin included in the conductive paste, one or a plurality of organic resins which are selected from organic resins functioning as a binder, a solvent, a dispersing agent, and a coating member for the metal particles can be used. Typically, the organic resin such as an epoxy resin and a silicon resin can be used. Further, when forming the conductive layer, baking the conductive paste is applied. For example, in the case of employing fine particles containing silver as a main component (e.g., the particle size is in the range from 1 nm to 100 nm, inclusive) as a material for the conductive paste, the conductive layer can be obtained by baking it within a temperature range of 150 to 300° C. to cure. Alternatively, fine particles containing solder or lead-free solder as a main component may be employed as well; in that case, fine particles having a particle size of 20 μm or less are preferably employed. Solder or lead-free solder has advantages such as a low cost.

As well as the aforementioned materials, ceramic, ferrite, or the like may be applied to the antenna.

In addition, when the electromagnetic coupling method or the electromagnetic induction method is applied and a wireless chip having the antenna is provided in contact with metal, a magnetic material having magnetic permeability is preferably provided between the semiconductor device and the metal. This is because eddy-current flows through the metal as the magnetic filed changes, and the communication range is decreased because the change of the magnetic field is weakened by demagnetizing field which is generated by the eddy-current. Therefore, by providing the material having the magnetic permeability between the wireless chip and the metal, the eddy-current of the metal can be suppressed to suppress decrease of the communication range. Note that ferrite having high magnetic permeability and low high-frequency loss or a metal thin film can be used for the magnetic material.

A wireless chip to which an antenna formed over the substrate for the antenna is adhered can be provided in this manner.

Embodiment 1

In this embodiment, a mode where a wireless chip having a memory cell is formed over a plastic substrate as a structural example of a semiconductor device of the present invention is described. Note that the wireless chip of this embodiment includes an RF circuit for performing wireless communication and a CPU as an operating circuit.

Table 1 shows communication specifications of the wireless chip of this embodiment.

TABLE 1

| | ISO | ISO/IEC 15693 (Part compliance) |
|---|---|---|
| | Frequency | 13.56 MHz |
| To semiconductor device | Modulation | Amplitude shift keying |
| From reader/writter | Modulation index | 100% |
| | Data rate | 26.48 kbits/s |
| | Data encode | Pulse-position modulation |
| | Data encode mode | One out of four |
| To reader/writter From semiconductor device | Communication signal interface | Load modulation |
| | Subcarrier frequency | 423.75 KHz |
| | Data rate | 26.48 kbits/s |
| | Data encode | Manchester system |

Radio signals of 13.56 MHz band are used for communication, and communications standards or protocols are partially based on ISO/IEC 15693. The wireless chip of this embodiment supplies power supply voltage by the radio signals through an antenna. The wireless chip of this embodiment has an external antenna; however, it may have a built-in antenna which is integrated with the circuit. Transfer rate of data is set at 26.48 kbit/s, data encoding from a reader/writer to the wireless chip is done by pulse-position modulation, and data encoding from the wireless chip to the reader/writer is done by Manchester method.

Table 2 shows a brief description of the wireless chip of this embodiment.

TABLE 2

| | | Total TFTs | 71K |
|---|---|---|---|
| | | Chip core size* | 20 mm × 20 mm × 195 µm (Core: 14 mm × 14 mm × 195 µm) |
| | | Weight* | 103 mg |
| Logic circuit | CPU | Frequency | 3.39 MHz |
| | | Total TFTs | 26K |
| | | Architecture | 8 b CISC |
| | | General register | 16 × 8 b |

TABLE 2-continued

| | | Address bus | 16 b |
|---|---|---|---|
| | | Data bus | 8 b |
| | ROM | Size | 2 KB |
| | RAM | Size | 64 B |
| | Controller | Tr count | 11K |
| | | Circuit configuration | CPU interface RF interface Register Clock control circuit |
| | RF circuit | Circuit configuration | Resonance capacitor Power circuit System reset circuit Clock generation circuit Demodulation circuit Modulation circuit |

*Antenna not included.

Since the wireless chip of this embodiment can be formed over a flexible substrate by using thin film transistors as described above, a very lightweight wireless chip which weights 103 mg can be provided.

Figure 9:
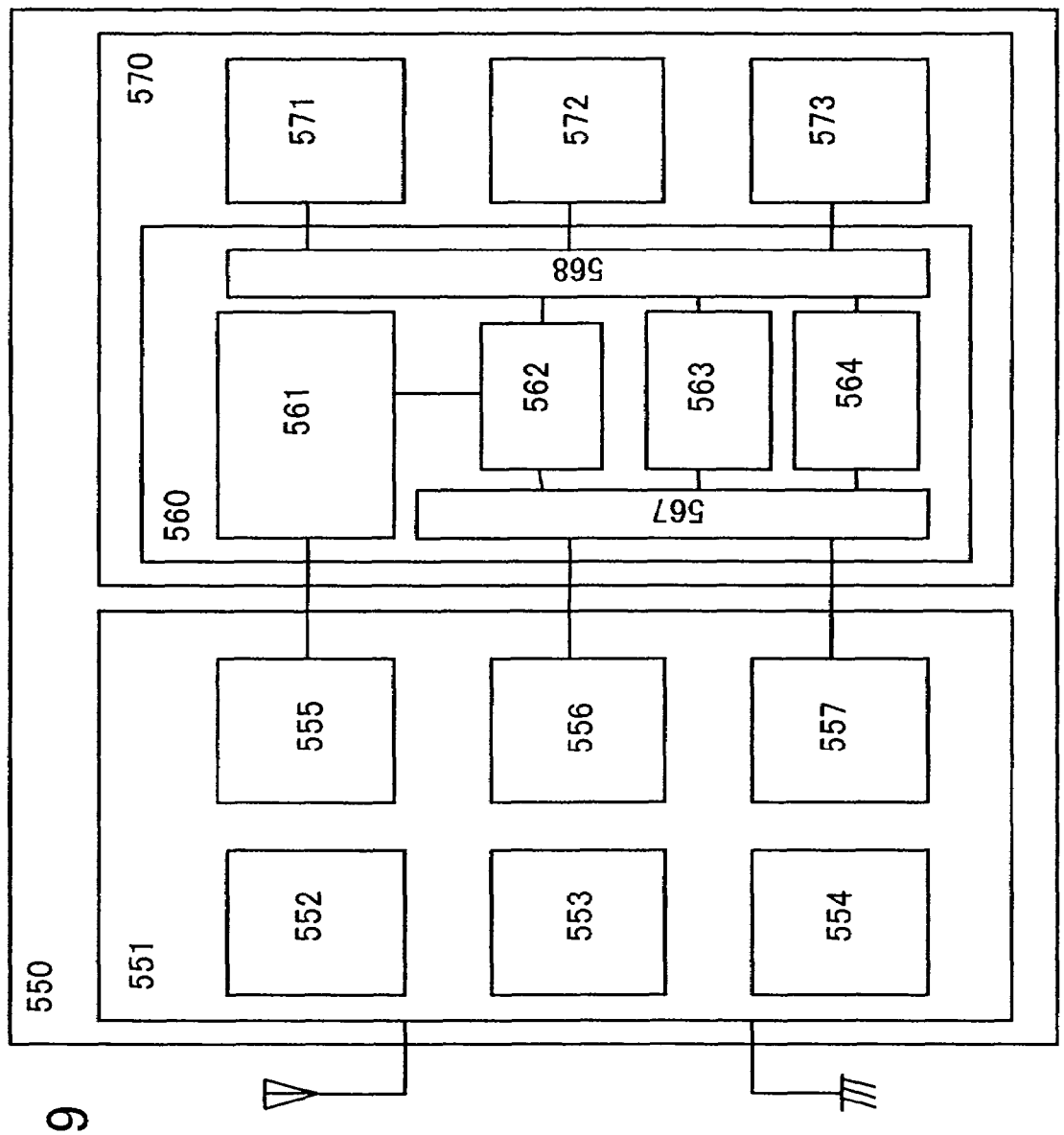
FIG. 9 is a diagram showing a block configuration of a wireless chip to which the present invention is applied.

Next, FIG. 9 shows a block configuration of the wireless chip of this embodiment. A wireless chip 550 of this embodiment includes a wireless circuit 551 and a logic circuit 570. The wireless circuit 551 includes a resonant capacitor 552, a power supply circuit 553, a system reset circuit 554, a clock generator 555, a demodulation circuit 556, a modulation circuit 557, and the like. The resonant capacitor 552 and the external antenna can form a resonant circuit. The power supply circuit 553 includes a rectifier circuit and a storage capacitor, and can generate power supply voltage. The system reset circuit 554 can generate system reset signals and the clock generator 555 can generate system clock signals. The demodulation circuit 556 includes an LPF (Low Pass Filter) and can extract data from radio signals. The modulation circuit 557 can superimpose data on the radio signals by Manchester method. These circuits can be formed using thin film transistors.

The logic circuit 570 includes a controller 560, a CPU 571, a ROM 572, a RAM 573, and the like. The controller 560 includes a clock control circuit 561, a control register 562, a receive data register 563, a transmit data register 564, a wireless interface 567, and a CPU interface 568. These circuits or the like can be formed using thin film transistors. The demodulation circuit 556 and the modulation circuit 557 can exchange signals with the control register 562, the receive data register 563, and the transmit data register 564 through the wireless interface 567. The clock generator 555 is controlled with the clock control circuit 561, and the clock control circuit 561 operates based on the control register 562. The control register 562, the receive data register 563, and the transmit data register 564 can exchange signals with the CPU 571, the ROM 572, and the RAM 573 through the CPU interface 568.

The CPU included in the wireless chip uses an 8-bit CISC (Complex Instruction Set Computer) and can be formed with a flip-flop which is operated using a two-phase non-overlap clock. By forming with the flip-flop which is operated using a two-phase non-overlap clock, variation in clock skew or malfunctions caused by characteristic variation in TFTs can be prevented so that reliability can be improved. The ROM of the present invention can be applied to the ROM 572, and a 2 KB mask ROM is used. Programs, private keys, and the like can be stored in the mask ROM. A 64B SRAM can be applied to the RAM 573 and the SRAM can be used as a work area of the CPU. The circuit configuration of the memory cell is devised in this manner to improve reliability of writing/reading. In addition, the controller 560 functions as a state machine of the wireless chip of this embodiment.

The wireless chip of this embodiment can employ SAFER (Secure And Fast Encryption Routine) as algorithm of cryptographic processing. SAFER is mainly constituted of 8-bit operation and is an algorithm suitable for an 8-bit CPU. A wireless chip having the wireless chip of this embodiment can have a function of decoding cipher text by using a private key after the cipher text is received and sending a plaintext. Needless to say, other algorithm of cryptographic processing such as DES or AES can be used for the wireless chip of this embodiment.

Figure 10:
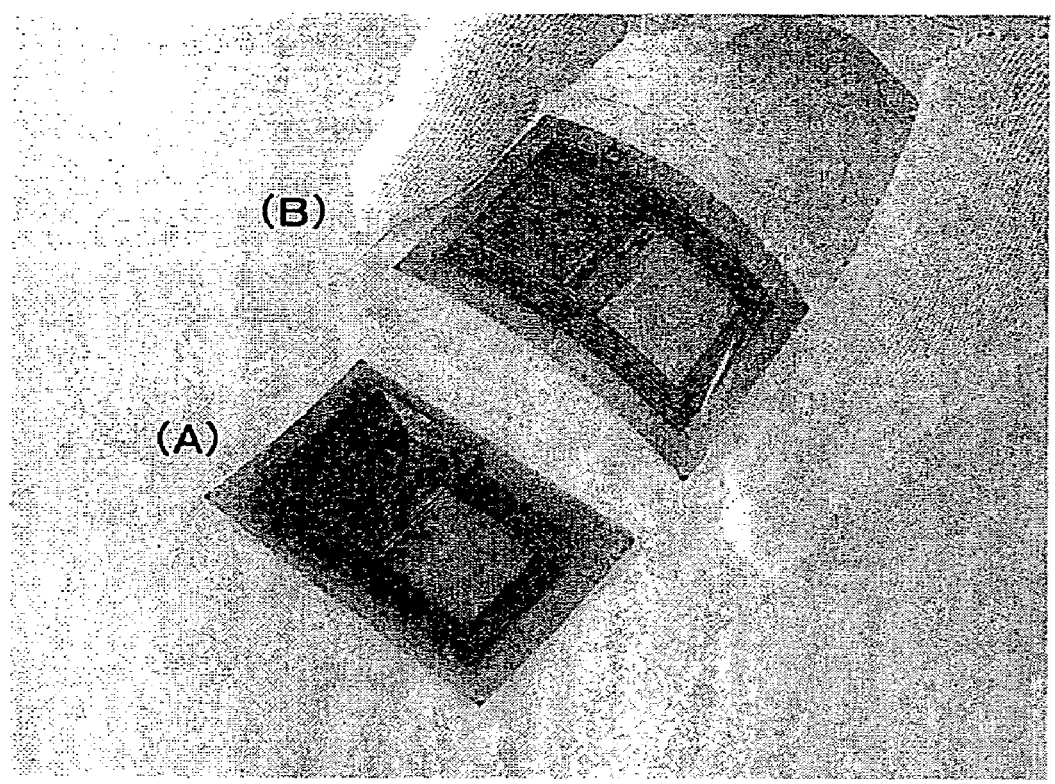
FIGS. 10A and 10B are photographs of a wireless chip formed over a glass substrate and a wireless chip formed over a flexible substrate.
Figure 11:
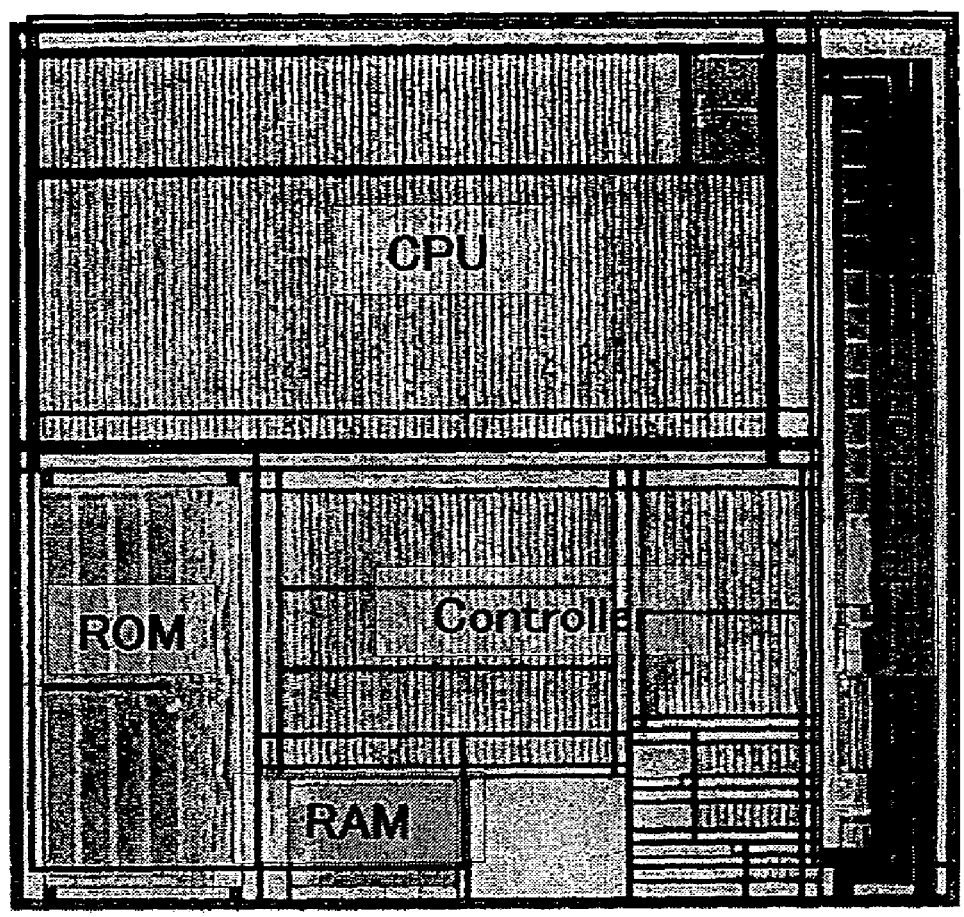
FIG. 11 is a macro photograph of a wireless chip on which a block diagram is drawn.

FIG. 10A is a photograph of a wireless chip which is formed over a glass substrate and FIG. 10B is a photograph of a wireless chip which is formed over a flexible substrate. The wireless chip of this embodiment can be very thin like the wireless chips. In addition, FIG. 11 is a macro photograph of the wireless chip illustrating a block diagram thereon. In FIG. 11, the configuration of a semiconductor device having the memory cell of the present invention can be applied to a ROM area. This application is based on Japanese Patent Application serial No. 2005-341109 filed in Japan Patent Office on Nov. 25, 2005, the entire contents of which are hereby incorporated by reference.

EXPLANATION OF REFERENCE

10: memory cell, 11: precharge circuit, 12: sense amplifier circuit, 15: data line, 16: word line, 20: GND line, 501: substrate for an antenna, 502: conductive layer (dipole antenna), 503: integrated circuit, 504: conductive layer (patch antenna), 505: conductive layer, 550: wireless chip, 551: wireless circuit, 552: resonant capacitor, 553: power supply circuit, 554: system reset circuit, 555: clock generator, 556: demodulation circuit, 557: modulation circuit, 560: controller, 561: clock control circuit, 562: control register, 563: receive data register, 564: transmit data register, 567: wireless interface, 568: CPU interface, 570: logic circuit, 571: CPU, 572: ROM, 573: RAM, 600: insulating substrate, 601: release layer, 602: insulating layer, 603: semiconductor film, 604: gate insulating film, 605: gate electrode, 607: sidewall, 608: impurity region, 609: impurity region, 611: insulating layer, 612: insulating layer, 613: wire, 615: thin film transistor (TFT), 616: TFT group, 619: wire, 620: insulating layer, 621: wire, 622: region, 623: pad, 624: region, 630: insulating layer, 631: organic compound layer, 632: wire, 640: antenna, 642: memory region, 643: integrated circuit area, 644: wire region, 645: pad region, 646: contact region, and 650: film substrate.

The invention claimed is:

1. A semiconductor device comprising:
a word line;
a data line;
a first transistor;
a second transistor;
a third transistor;
an inverter; and
a NAND circuit,
wherein one of a source and a drain of the first transistor is electrically connected to the data line,
wherein one of a source and a drain of the second transistor is electrically connected to the data line,
wherein one of a source and a drain of the third transistor is electrically connected to the data line,
wherein a gate terminal of the second transistor is electrically connected to one of input terminals of the NAND circuit,
wherein an output terminal of the NAND circuit is electrically connected to an input terminal of the inverter, and
wherein an output terminal of the inverter is electrically connected to the word line.

2. A semiconductor device comprising:
a word line;
a data line;
a first transistor;
a second transistor;
a third transistor;
an inverter; and
a NAND circuit,
wherein one of a source and a drain of the first transistor is electrically connected to the data line,
wherein one of a source and a drain of the second transistor is electrically connected to the data line,
wherein one of a source and a drain of the third transistor is electrically connected to the data line,
wherein the word line is electrically connected to a gate terminal of the first transistor,
wherein a gate terminal of the second transistor is electrically connected to one of input terminals of the NAND circuit,
wherein an output terminal of the NAND circuit is electrically connected to an input terminal of the inverter, and
wherein an output terminal of the inverter is electrically connected to the word line.

3. A semiconductor device comprising:
a data line;
a word line;
a first transistor;
a second transistor;
a third transistor;
a first inverter;
a second inverter; and
a NAND circuit,
wherein one of a source and a drain of the first transistor is electrically connected to the data line,
wherein one of a source and a drain of the second transistor is electrically connected to the data line,
wherein one of a source and a drain of the third transistor is electrically connected to the data line, and an input terminal of the second inverter is electrically connected to the data line and an output terminal of the second inverter is electrically connected to a gate terminal of the third transistor,
wherein the word line is electrically connected to a gate terminal of the first transistor;
wherein an output terminal of the NAND circuit is electrically connected to an input terminal of the first inverter, and
wherein an output terminal of the first inverter is electrically connected to the word line.

4. A semiconductor device comprising:
a data line;
a word line;
a first transistor;
a second transistor;
a third transistor;
a first inverter;
a second inverter; and
a NAND circuit,
wherein one of a source and a drain of the first transistor is electrically connected to the data line, wherein one of a source and a drain of the second transistor is electrically connected to the data line, wherein one of a source and a drain of the third transistor is electrically connected to the data line, and an input terminal of the second inverter is electrically connected to the data line and an output terminal of the second inverter is electrically connected to a gate terminal of the third transistor, wherein the word line is electrically connected to a gate terminal of the first transistor, wherein an address signal is inputted to a first input terminal of the NAND circuit, wherein a reset signal is inputted to a second input terminal of the NAND circuit, wherein an output terminal of the NAND circuit is electrically connected to an input terminal of the first inverter, and wherein an output terminal of the first inverter is electrically connected to the word line.

5. The semiconductor device according to any one of claims 1 to 4, wherein the other of the source and the drain of the first transistor is set as a ground potential.

6. The semiconductor device according to any one of claims 1 to 4, wherein the other of the source and the drain of the first transistor is electrically connected to a wire, and is set as a ground potential.

7. The semiconductor device according to any one of claims 1 to 4, wherein the other of the source and the drain of the first transistor is in a floating state.

8. The semiconductor device according to any one of claims 1 to 4, wherein the other of the source and the drain of the secondp transistor is set as a high side potential.

9. The semiconductor device according to any one of claims 1 to 4, wherein the other of the source and the drain of the third transistor is set as a high side potential.

10. The semiconductor device according to any one of claims 1 to 4, wherein the first transistor is an N-channel transistor.

11. The semiconductor device according to any one of claims 1 to 4, wherein the second transistor is a P-channel transistor.

12. The semiconductor device according to any one of claims 1 to 4, wherein the third transistor is a P-channel transistor.

* * * * *